(12) United States Patent
Cho

(10) Patent No.: US 7,534,966 B2
(45) Date of Patent: May 19, 2009

(54) EDGE CONNECTION STRUCTURE FOR PRINTED CIRCUIT BOARDS

(75) Inventor: Seong Bean Cho, Seoul (KR)

(73) Assignee: Clear Electronics, Inc., Princeton, NJ (US)

( * ) Notice: Subject to any disclaimer, the term of this patent is extended or adjusted under 35 U.S.C. 154(b) by 181 days.

(21) Appl. No.: 11/751,877

(22) Filed: Jun. 12, 2007

(65) Prior Publication Data

US 2008/0311771 A1     Dec. 18, 2008

(51) Int. Cl.
    *H05K 3/36*     (2006.01)
(52) U.S. Cl. ............... 174/260; 174/261; 361/792; 361/790; 430/55; 430/951
(58) Field of Classification Search ............ 174/260, 174/261; 361/792, 790; 439/55, 951
    See application file for complete search history.

(56) References Cited

U.S. PATENT DOCUMENTS

| | | | |
|---|---|---|---|
| 4,549,200 A * | 10/1985 | Ecker et al. .......... | 174/260 |
| 5,345,256 A * | 9/1994 | Stortz ................ | 347/20 |
| 6,634,561 B1 | 10/2003 | Wallace | |
| 6,646,885 B1 | 11/2003 | Yu et al. | |
| 6,768,645 B2 | 7/2004 | Kadonaga | |
| 6,826,827 B1 * | 12/2004 | Fjelstad ............. | 29/830 |
| 2002/0158646 A1 | 10/2002 | DiFrancesco | |
| 2004/0062112 A1 | 4/2004 | Nishizawa et al. | |
| 2004/0066693 A1 | 4/2004 | Osako et al. | |
| 2004/0084538 A1 | 5/2004 | Nishizawa et al. | |
| 2005/0279838 A1 | 12/2005 | Wang et al. | |
| 2007/0093139 A1 | 4/2007 | Kinsley | |

* cited by examiner

*Primary Examiner*—Gary F Paumen
(74) *Attorney, Agent, or Firm*—Duane Morris LLP

(57) ABSTRACT

A printed circuit board (PCB) edge connection structure formed by a first PCB having one or more electronic components and printed circuitry provided thereon and a second PCB, having one or more edge contact pads provided thereon, attached to the first PCB and covering an area on the first PCB into which a portion of the printed circuitry extends. The resulting structure maximizes the utilization of the surface area on the first PCB for printed circuitry, thus, reducing the overall size of the end product.

21 Claims, 4 Drawing Sheets

EDGE CONNECTION STRUCTURE FOR PRINTED CIRCUIT BOARDS

FIELD OF THE INVENTION

The present invention relates to a printed circuit board (PCB) edge connection technology such as the connections made along an edge of a PCB via contact terminals.

BACKGROUND

Digital data storage devices have been developed in many different formats. Recent years, CDs (compact discs) and DVDs (digital video discs) have been popular data storage devices as recordable and prerecorded media. There are even smaller versions of CDs and DVDs and called mini CDs and mini DVDs. But these data storage media require hardware such as hard (laser) disc drives to write or retrieve data. And because the disc drives have to accommodate these large storage media and require moving mechanical parts and laser sensors, they are relatively large in size.

The more recently developed static blank digital media called flash memory drives typically found in digital cameras, MP3 players, camcorders and the like are smaller in size and have become popular. There are several commercial product formats such as Compact Flash, SD and XD cards, etc., but all of these utilize flash memory chips as storage memory and they have no moving mechanical components. One type of such flash memory chip storage media that is popular with personal computer are Universal Serial Bus (USB) flash memory drives. The USB flash memory drives are plug-in devices configured to be plugged into the USB port of a personal computer and data can be stored in and retrieved from them.

The USB flash memory drives have the standard USB Type A connector at one end for plugging into the USB Type A port socket on computers and one, sometimes two, PCBs forming the reminder of the device. The one or more PCBs have the necessary electronic components thereon, such as the flash memory chip and the associated controller circuit devices. The PCBs are of conventional construction with printed circuitry (i.e. conductive lines and through-vias, etc.) connecting the various electronic components.

There are a number of conventional ways the USB connector end of the USB flash memory devices are formed. In one of the conventional construction, the contact terminals or pads in the USB connector is formed by pressed metal contact pads soldered onto an end of a PCB sized to fit into a USB Type A socket. The PCB is where the memory chip(s), controller IC, and other supporting electrical components for the flash memory device are installed. The terms "terminals" or "pads" will be used interchangeably in this document to generically refer to metallized areas on a PCB that are intended for temporary or permanent electrical connection with other structures. Such electrical connections may be made by mechanical contact, solder joint, or any other suitable type of attachments used in the electronics packaging industry. In another conventional construction, the contact pads for the edge connection are formed directly on the PCB as an extension of the printed circuit metallurgy on the PCB. The contact pads are patterned along the edge of the PCB and sufficient portion of the pads are exposed for making contact. Typically, the printed circuit metallurgy on PCBs have copper as the base metal and the exposed portions of the contact pads are plated with nickel then gold. These conventional construction methods are utilized in previously mentioned data storage media products such as USB flash memory drives, Compact Flash, SD and XD cards, for example.

One of the disadvantages of the conventional edge connection contact constructions discussed above is that a substantial portion of the limited space on the PCB is taken up by the edge connection contact pads. Thus, the space necessary for all of the printed circuitry (i.e. the wiring) necessary to interconnect the various electronic devices on the PCB must come from the remainder of the PCB. This places limits on the product designer's ability to make the PCBs for the computer plug-in devices such as the flash memory devices small as possible. Therefore, there is a need for a new advance in the electronic packaging technology that will provide the product designers the ability to shrink the PCBs further to meet the demands of the consumers' desires for smaller, more convenient and attractive products.

You can not reduce the total thickness of contact terminals less than 1.9 mm or more than 2.3 mm because of the given dimensions for adopting USB port. The tolerances of the thickness of contact terminal for USB drive are less than 2.4 mm and greater than 2 mm. With these restrictions, you can not install any parts on the PCB right behind of the contact terminals, which will create short circuit with USB port (Drawing B-3). The space between the contact terminal and the main part of the pcb on the terminal side can not be raised for the length of 9.5 mm from the end of the terminal side. Re Drawing B"—Remarks; You can not use the spaces B-4 not only for the 1) any electrical parts but also 2) any patterns lines and/or via holes for the fear of short circuiting with the usb port when inserted. Or it simply can not fit into the usb port because of the height if parts were soldered on the main pcb.

SUMMARY

According to a preferred embodiment a printed circuit board (PCB) edge connection structure is disclosed. The PCB edge connector comprises a first PCB having one or more electronic components and printed circuitry provided thereon. A second PCB is attached to the first PCB and covers an area on the first PCB into which a portion of the printed circuitry on the first PCB extends. Because the area underneath the second PCB is made available for the printed circuitry, the usage of the surface area of the first PCB is more efficient than in conventional PCB edge connector structures. One or more contact pads are provided on the second PCB.

When such PCB edge connection structure is incorporated into a plug-in device and the device is plugged into an appropriate mating socket, electrical connections are established between the one or more contact pads and the corresponding contacts in the mating socket. This, in turn, allows the electronic components on the first PCB to communicate with whatever devices are connected to the socket.

According to another embodiment, a PCB edge connection structure comprises a first PCB having one or more electronic components, printed circuitry and a first set of two or more soldering terminals provided thereon. A second PCB is attached to the first PCB and covers an area on the first PCB into which a portion of the printed circuitry on the first PCB extends. The second PCB has first and second sides and one or more contact pads provided on the first side. A second set of two or more soldering terminals are provided along one or more edges of the second PCB and the second PCB is attached to the first PCB with the first side facing away from the first PCB. The attachment is accomplished by solder joints connecting the first set of two or more soldering terminals to the second set of two or more soldering terminals.

The second PCB is aligned and positioned so that it is within the perimeter of the first PCB and does not extend beyond the perimeter. The soldering terminals that join the second PCB to the first PCB are positioned along the edge of the second PCB to maximize the useability of the area on the first PCB underneath the second PCB for laying out printed circuitry. This efficient use of the surface area on the first PCB and allows the overall size of the first PCB to be smallest possible for a given circuit design. In an alternate embodiment, the second PCB positioned at least partially on the first PCB.

According to another embodiment a plug-in device for a computer, for examples is disclosed. The plug-in device incorporates the PCB edge connection structure disclosed herein and allows the plug-in device to be small as possible for a given set of electronic components that make up the device. An example of such a plug-in device is a USB flash drive (also known as thumb drives, jump drives, etc.) that plugs into the USB port of a computer.

BRIEF DESCRIPTION OF THE DRAWINGS

The features of the preferred embodiments will be described with reference to the following drawings where like elements are labeled similarly, and in which.

All drawings are schematic and are not drawn to scale.

DETAILED DESCRIPTION

Figure 1:
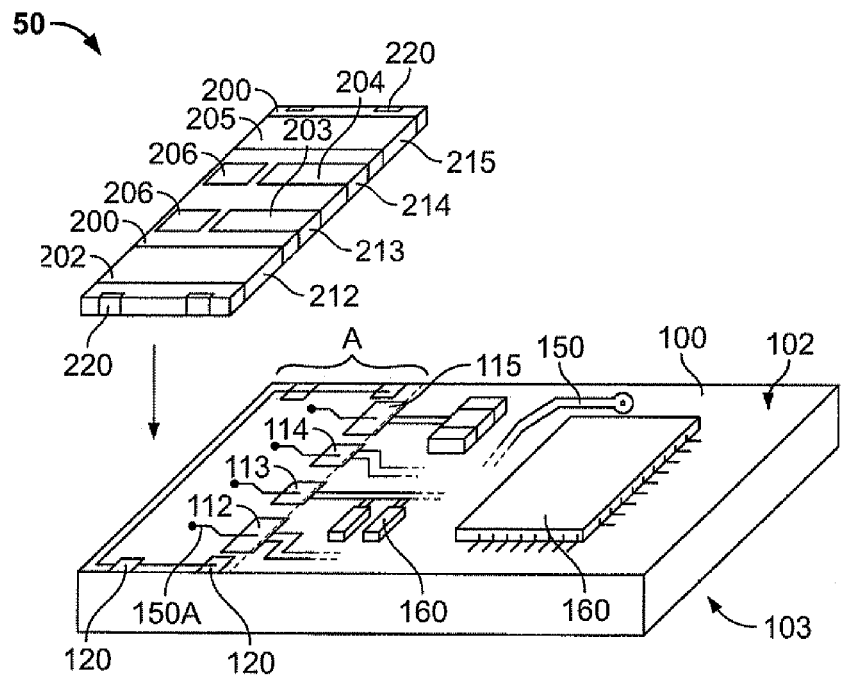
FIG. 1 is a perspective view of components of a PCB edge connection structure according to an embodiment.

Referring to FIG. 1 a preferred embodiment of the novel PCB edge connection structure 50 is illustrated. The PCB edge connection structure 50 comprises a first PCB 100 and a PCB contact terminal structure 200. The first PCB 100 has a top side 102 and a bottom side 103. Provided on the top side 102 of the first PCB 100 are one or more electronic components 160 and the associated printed circuitry 150. The printed circuitry provides the wiring that interconnects the various electronic components 160. A set of two or more soldering terminals 112, 113, 114 and 115 are also provided on the first PCB 100 to which the PCB contact terminal structure 200 gets attached.

Figure 2:
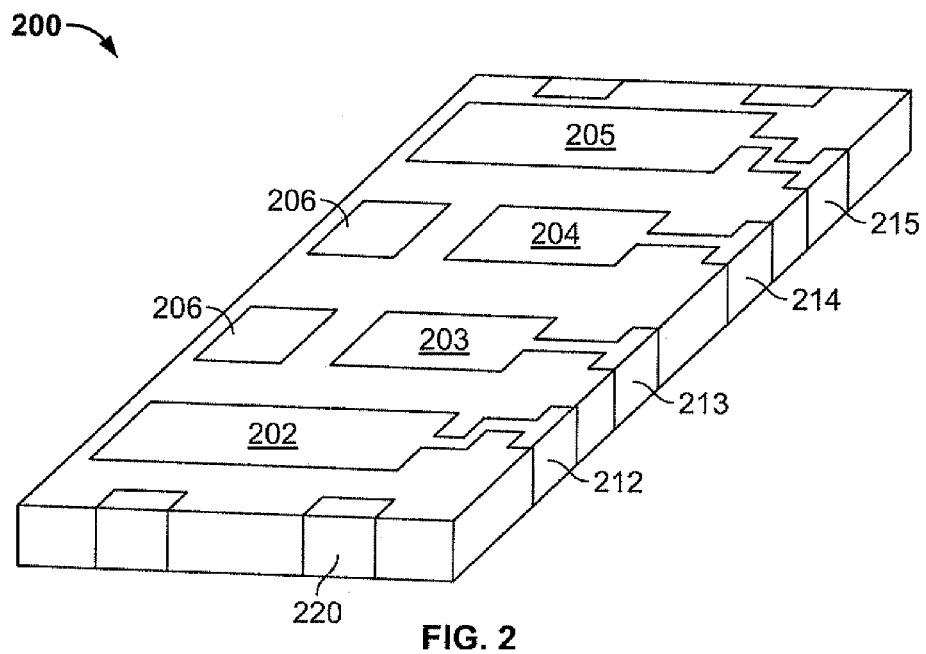
FIG. 2 is an illustration of another embodiment of a PCB contact terminal structure.

The PCB contact terminal structure 200 has one or more contact pads 202, 203, 204, 205 provided on its top side. The contact pads 202, 203, 204, 205 extend down one or more side edges of the PCB contact terminal structure 200 and form a set of soldering terminals 212, 213, 214 and 215 that correspond to the first set of soldering terminals 112, 113, 114 and 115 on the first PCB 100. In another embodiment, as shown in FIG. 2, the connection between the contact pads 202, 203, 204, 205 and the soldering terminals 212, 213, 214 and 215 on the PCB contact terminal structure 200 can be formed by printed circuit lines 207.

The PCB contact terminal structure 200 can also be provided with non-functional pads 206 if appropriate for aesthetic purposes. One or more such non-functional pads can be utilized in conjunction with the functional contact pads to provide a desired patterned design on the PCB contact terminal structure 200. The actual number, location and size of these non-functional pads will depend on such factors as the design of the desired pattern and the number, location and size of the functional pads.

Figure 4:
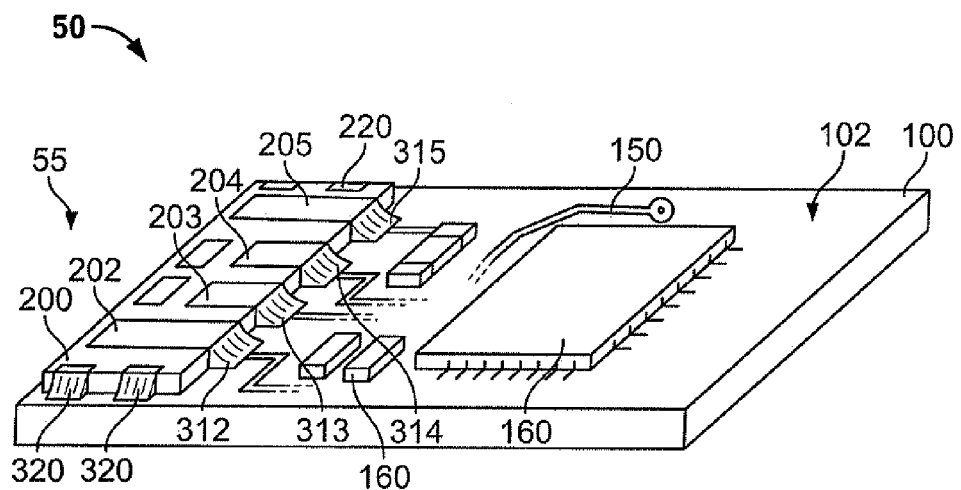
FIG. 4 is a perspective view of the components of FIG. 1 in an assembled state.

During assembly of the PCB edge connection structure 50, the PCB contact terminal structure 200 is placed over area A of the first PCB 100 with the two sets of the soldering terminals aligned and the soldering terminals are joined by solder joints 312, 313, 314, 315 (see FIG. 4). The solder attachment of the PCB contact terminal structure 200 to the first PCB can be done at the same time as the electronic components 160. Typically, the electronic components 160 are surface-mount types and the solder joining process can be carried out by treating the PCB contact terminal structure 200 as just another surface-mount component. Then, the PCB contact terminal structure 200 and the other surface-mount electronic components 160 are placed on the top side 102 of the first PCB and then soldered using conventional surface-mount solder attachment process.

Figure 3:
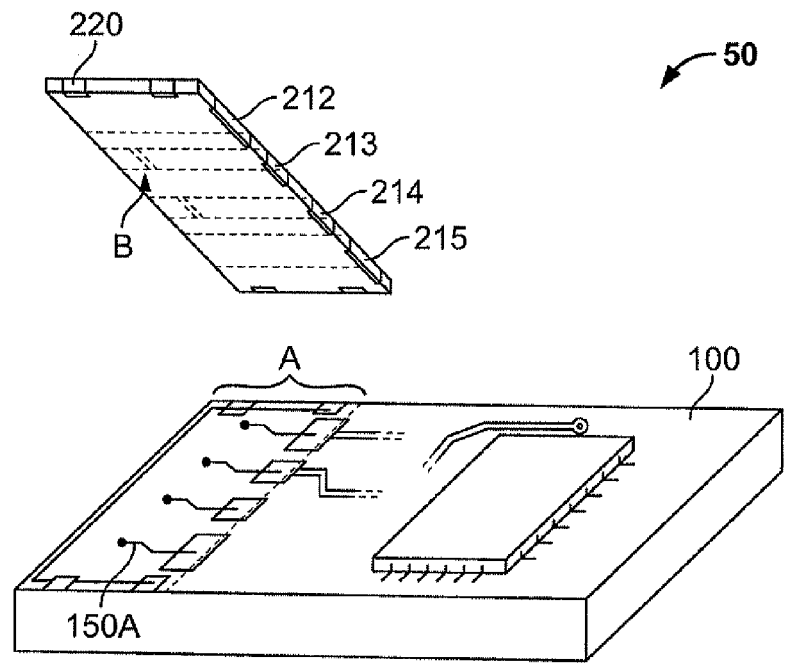
FIG. 3 is another perspective view of the components shown in FIG. 1.

Referring to FIGS. 1 and 3, because the contact pads 202, 203, 204, 205 are provided on the top surface of the PCB contact terminal structure 200, the area A on the first PCB that gets covered by the PCB contact terminal structure 200 is available for laying out the printed circuitry 150 on the top surface 102 of the first PCB 100. As shown, a portion of the printed circuitry 150A extends into the region A. This allows more of the top surface of the first PCB 100 to be used for printed circuitry 150 so that more printed circuitry can be designed into a given size of the first PCB 100. In other words, a given plug-in product can be made smaller using the present invention because a smaller first PCB 100 can accommodate the same amount of printed circuitry that required larger PCB that utilized a conventional PCB edge connector structure.

As shown in FIG. 3, the soldering terminals 212, 213, 214, 215 on the PCB contact terminal structure 200 may be constructed to wrap around and extend a small distance into the underside B of the PCB contact terminal structure 200. But the remainder of the underside B is either free of any metallic or otherwise conductive features and may be coated or masked with a layer of insulating material. The area A on the first PCB covered by the PCB contact terminal structure 200 also can be coated or masked with a layer of insulating material to protect the printed circuitry 150A and to prevent any unwanted shorting contaminants or defects. In such embodiment, the insulating material covering the area A will be patterned so that the soldering terminals 112, 113, 114, 115 are exposed.

If necessary and appropriate, one or more non-functional soldering anchor terminals 220 can be provided on the PCB contact terminal structure 200 and corresponding soldering terminals 120 provided on the first PCB 100. Such non-functional soldering anchor terminals can be used to provide terminals where purely structural anchoring solder joints 320 (see FIG. 4) can be formed to reinforce the strength, reliability and integrity of the attachment between the PCB contact terminal structure 200 and the first PCB 100. The number and the actual location of the soldering terminals, both functional as well as any non-functional ones, will vary and will be determined by the particular product design and engineering requirements. For example, the number and particular shape, location and arrangement of the contact pads provided on the top side of the PCB contact terminal will also be determined by and will vary depending or the particular product design and engineering requirements. And that in turn will affect the number and locations of the associated soldering terminals on the two PCBs. The exemplary PCB edge connection structure 50 shown in FIGS. 1-4 illustrate one embodiment of such structure that can be used for USB Type A connection. USB connections generally have four leads: two power lines Vdd and Ground; and two signal lines D+ and D−. In the exemplary structure illustrated in FIGS. 1-4, the functional assignments for the contact pads 202, 203, 204, 205 can be Vdd, D+, D−, Ground, respectively. Then the soldering terminals 112, 113, 114 and 115 on the first PCB 100 are appropriately wired to the various electronic components 160 by the printed circuitry 150.

FIG. 4 shows the fully assembled PCB edge connection structure 50. The edge connector end 55 of the assembly is inserted into an appropriate mating socket or a connector. Where the structure 50 forms a USB flash memory drive, for example, the dimension of the first PCB 100 and the PCB contact terminal 200 is appropriately selected to fit into a USB Type A port socket. The configuration and arrangement of the contact pads 202, 203, 204, 205 is designed to make appropriate electrical connection with the corresponding contact leads in a USB Type A port socket when the edge connector end 55 is inserted into the USB Type A port socket.

Figure 5:
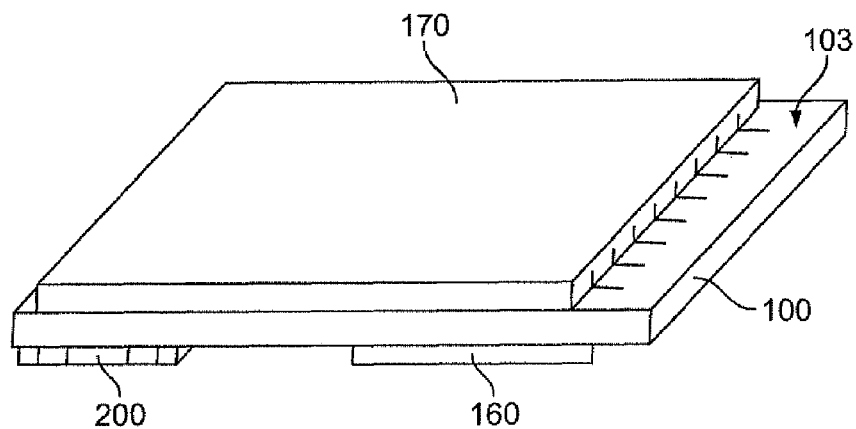
FIG. 5 is another view of the assembly of FIG. 4.

FIG. 5 is a view of the PCB edge connection structure 50 (also referred to herein as the plug-in device) from the bottom side 103 of the first PCB 100 where another electronic component, a flash memory chip 170, for example, is attached to the bottom side 103 of the first PCB 100. This example is an embodiment where the device is a USB flash memory drive. The first PCB 100 in this example is double-sided. In other words, both sides of the PCB 100 has printed circuitry wiring and various components can be mounted on both sides of the PCB 100. It should be noted that because the area A under the PCB contact terminal 200 on the top side 102 of the PCB 100 can be utilized for printed circuit wiring, that also allows the printed circuit wiring on the bottom side 103 of the PCB 100 to be readily extended to the area below the PCB contact terminal 200. This, in turn, allows the PCB 100 to be not much larger than the flash memory chip 170 and the overall size of the plug-in device 50, which in this example is a USB flash memory drive, can be made to be substantially the same size as the footprint of the flash memory chip 170. In such flash memory drives, the flash memory chip is generally the largest component and, thus, establish the lower limit on the size of the main PCB 100. Thus, by maximizing the surface utilization of the top and bottom sides 102, 103 of the main PCB 100, the present invention allows the main PCB 100 to be reduced down to the size of the flash memory chip 170.

Figure 6:
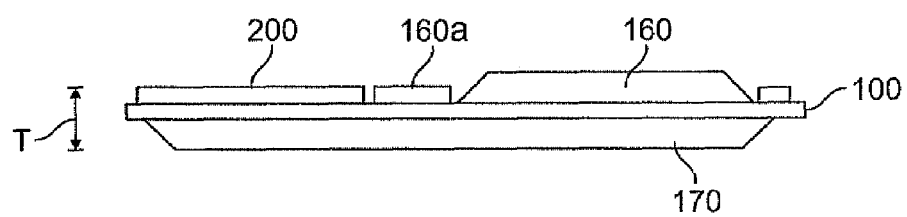
FIG. 6 is a side view of the assembly of FIG. 4.

FIG. 6 shows the side view of the device of FIG. 5. The thickness T of the edge connector end 55 including the flash memory chip 170 is appropriately dimensioned to be inserted into the mating socket (e.g., a USB Type A port sock et). This is accomplished by selecting the thicknesses of the first PCB 100 and the PCB contact terminal structure 200 such that when added to the thickness of the flash memory chip 170, the total thickness T is the desired dimension. Furthermore, as illustrated in FIGS. 1, 4 and 6, the electronic components can be placed very close to the PCB contact terminal structure 200. In conventional PCB edge connection structures, whether utilizing pressed metal contact pads or printed circuit metallurgy directly formed on the main PCB, the region close to the edge contact pads are off limits to electronic components because of the possibility of physical interference with the edge connectors and the possibility of electrical shorting. Unlike the conventional structures, the novel PCB edge connection structure described herein allows electronic components 160 to be placed very close to the PCB contact terminal structure 200. FIG. 6 shows an electronic component 160a that is placed close to the PCB contact terminal structure 200. Because the PCB contact terminal structure 200 raises the plane of the contact terminals 202, 203, 204, 205 to be higher than the surface of the main PCB 100, the components 160a can be placed close to the PCB contact terminal structure 200 without the concerns present in the conventional edge connection structures. This further attributes to the more efficient utilization of the surface area of the main PCB 100.

Figure 7:
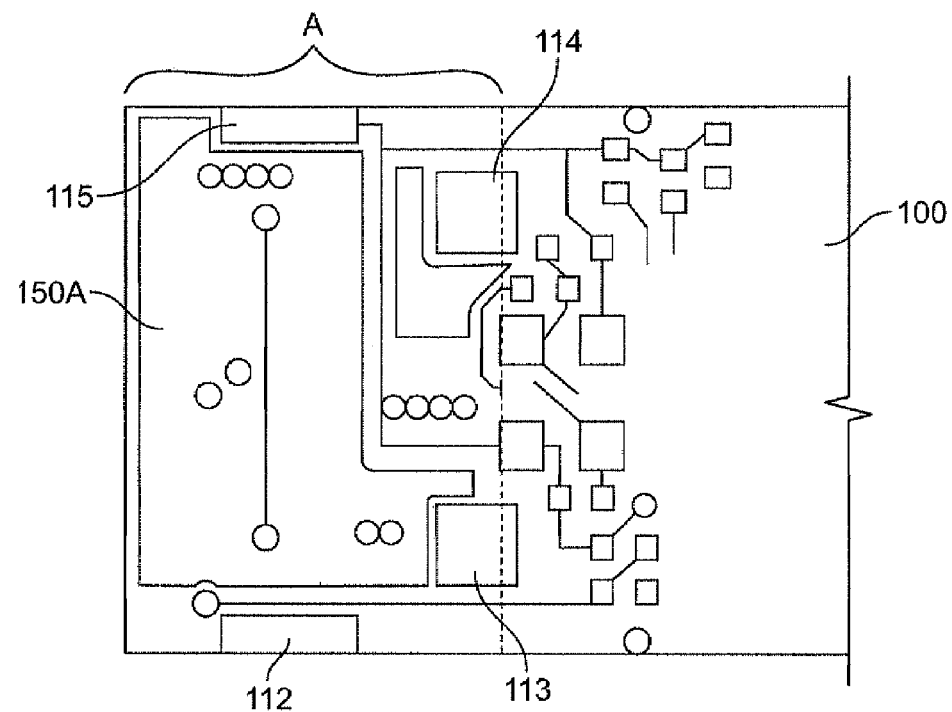
FIG. 7 is an illustration of another embodiment of the first PCB of FIG. 1.

FIG. 7 shows another example of a printed circuitry 150A extending into the region below the PCB contact terminal structure 200 utilizing the area previously not available for such use in the conventional PCB edge connector structures. In this example, there are four soldering terminals 112, 113, 114, 115. As discussed before, the particular number and location of the soldering terminals on the PCB 100 and the corresponding soldering terminals on the PCB contact terminal structure 200 are determined or dictated by the particular product design and are matters of design choice.

Similarly, the number and location of the contact pads on the PCB contact terminal structure 200 are also matters of design choice dictated by the requirements of the connection hardware format. In the preferred embodiments described herein, the connection hardware format is USB Type A connector and, thus, the contact pads on the PCB contact terminal structure 200 have to be designed to have the dimensions and locations appropriate for such connector standard. However, it would be readily apparent to one of ordinary skill in the art that the novel edge connection structure described herein can be applied to any other type of connection hardware format that can be constructed as PCB edge connectors.

The first PCB 100 and the PCB contact terminal structure 200 are constructed of same or similar circuit board material that are common in the industry, such as epoxy board, etc. In order to minimize any thermal expansion differences between the first PCB 100 and the PCB contact terminal structure 200, preferably the two PCB structures are made of the same material. If the two PCBs have sufficiently different coefficient of thermal expansion, they will expand and contract at different rates and by different amount. The result is that undesirable amount of stress can be exerted on the solder joints connecting the two PCBs. This is undesirable because that could lead to fatigue failure of the solder joints.

Figure 8:
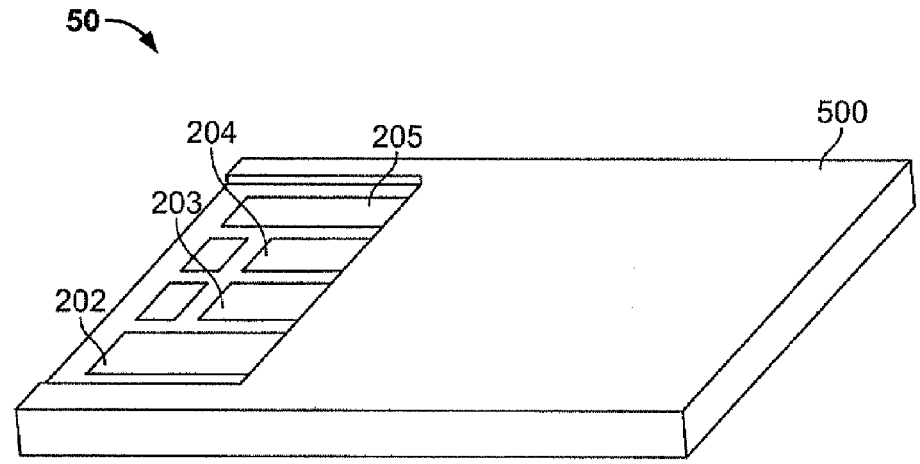
FIG. 8 is an illustration of a fully encapsulated finished product version of the assembly of FIG. 4.

FIG. 8 is an illustration of the assembled plug-in device 50 of FIGS. 4-6, that has been encapsulated in a housing 500. In a preferred embodiment, the housing 500 is injection molded polymer that encapsulates the plug-in device 50 except for the edge connection contact pads 202, 203, 204, 205. The contact pads are exposed so that it can make electrical connection with the mating socket leads. In another embodiment, the housing 500 can be a clamshell type two-piece housing that snaps together, capturing the plug-in device 50 inside.

The metal structures, such as the printed circuitry, the soldering terminals and the contact pads on the first PCB and the PCB contact terminal structure can be formed by any one of the conventionally known metallization processes. One such method is to start with copper plated blank FR-4 boards. The blank FR-4 can be double sided or single sided depending on the need. Holes for through-vias are then drilled. The patterns for the printed circuit wiring and the various terminals are then formed using such process as silk screening and etching. Then the board surface is masked exposing such areas as the contact pads and soldering terminals. The exposed portions are then generally plated with nickel and finished with gold plating.

According to another embodiment, the PCB contact terminal structure 200 can be made of a double sided or multiple layer PCB depending on the complexity of the circuitry required. Such structure could be necessary in some applications where internal ground or reference voltage planes, for example, are desired in the PCB contact terminal structure 200.

Furthermore, although the first PCB 100 and the PCB contact terminal structure 200 in the illustrated examples are attached by solder joints 312, 313, 314, 315, the present invention is not limited to the use of the solder only. The two PCBs can be attached by other suitable joining means, such as, conductive adhesives joining the terminals 212, 213, 214, 215 to the corresponding terminals 112, 113, 114 and 115, respectively.

The novel PCB edge connection structure discussed herein allows devices such as USB flash memory drives to be packaged smaller, thus, more portable and convenient. While the foregoing description and drawings represent preferred or exemplary embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. The presently disclosed embodiments are therefore to be considered in all respects as illustrative and not restrictive, the scope of the invention being defined by the appended claims, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A printed circuit board (PCB) edge connection structure comprising:
    a first PCB having one or more electronic components and printed circuitry provided thereon; and
    a second PCB attached to and in direct engagement with the first PCB and covering an area on the first PCB into which a portion of the printed circuitry extends, wherein one or more contact pads are provided on the second PCB.

2. The PCB edge connection structure of claim 1, wherein the one or more contact pads provided on the second PCB is electrically connected to the one or more electronic components on the first PCB.

3. The PCB edge connection structure of claim 1, further comprising:
    a first set of two or more soldering terminals provided on the first PCB; and
    a second set of two or more soldering terminals provided along one or more edges of the second PCB, wherein the attachment is accomplished by solder joints connecting the first set of two or more soldering terminals to the second set of two or more soldering terminals.

4. The PCB edge connection structure of claim 3, wherein at least one of the one or more contact pads provided on the second PCB is electrically connected to one of the two or more soldering terminals provided thereon providing electrical connection to the one or more electronic components via the solder joints connecting the first and second sets of the soldering terminals.

5. The PCB edge connection structure of claim 4, wherein the electrical connection between the at least one of the one or more contact pads provided on the second PCB and the two or more soldering terminals provided thereon are established by conductive lines provided on the second PCB.

6. The PCB edge connection structure of claim 3, wherein the second set of two or more soldering terminals extend from the first side to the second side of the second PCB.

7. The PCB edge connection structure of claim 1, wherein the second PCB is positioned at least partially on the first PCB.

8. The PCB edge connection structure of claim 1, wherein the second PCB is positioned on the first PCB to be within the first PCB's perimeter whereby no part of the second PCB extends beyond the perimeter of the first PCB.

9. A printed circuit board (PCB) edge connection structure comprising:
    a first PCB having one or more electronic components, printed circuitry and a first set of two or more soldering terminals provided thereon;
    a second PCB attached to the first PCB and covering an area on the first PCB into which a portion of the printed circuitry extends, the second PCB having first and second sides and one or more contact pads provided on the first side; and
    a second set of two or more soldering terminals provided along one or more edges of the second PCB, wherein the second PCB is attached to the first PCB with the first side facing away from the first PCB and the attachment is accomplished by solder joints directly connecting the first set of two or more soldering terminals to the second set of two or more soldering terminals.

10. The PCB edge connection structure of claim 9, wherein at least one of the one or more contact pads provided on the first side of the second PCB is electrically connected to one of the two or more soldering terminals provided thereon providing electrical connection to the one or more electronic components via the solder joints connecting the first and second sets of the soldering terminals.

11. The PCB edge connection structure of claim 10, wherein the electrical connections between the at least one of the one or more contact pads provided on the first side of the second PCB and the two or more soldering terminals provided thereon are established by conductive lines provided on the first side of the second PCB.

12. The PCB edge connection structure of claim 9, wherein the second set of two or more soldering terminals extend from the first side to the second side of the second PCB.

13. The PCB edge connection structure of claim 9, wherein the second PCB is positioned at least partially on the first PCB.

14. The PCB edge connection structure of claim 9, wherein the second PCB is positioned on the first PCB to be within the first PCB's perimeter whereby no part of the second PCB extends beyond the perimeter of the first PCB.

15. A plug-in device for a computer comprising:
    a PCB edge connection structure comprising:
        a first PCB having one or more electronic components, printed circuitry and a first set of two or more soldering terminals provided thereon;
        a second PCB attached to the first PCB and covering an area on the first PCB into which a portion of the printed circuitry extends, the second PCB having first and second sides and one or more contact pads provided on the first side; and
        a second set of two or more soldering terminals provided along one or more edges of the second PCB, wherein the second PCB is attached to the first PCB with the first side facing away from the first PCB and the attachment is accomplished by solder joints directly connecting the second set of two or more soldering terminals to the first set of two or more soldering terminals.

16. The plug-in device of claim 15, wherein at least one of the one or more contact pads provided on the first side of the second PCB is electrically connected to one of the two or more soldering terminals provided thereon providing electrical connection to the one or more electronic components via the solder joints connecting the first and second sets of the soldering terminals.

17. The plug-in device of claim 16, wherein the electrical connections between the at least one of the one or more contact pads provided on the first side of the second PCB and the two or more soldering terminals provided thereon are established by conductive lines provided on the first side of the second PCB.

18. The plug-in device of claim 15, wherein the second set of two or more soldering terminals extend from the first side to the second side of the second PCB.

19. The plug-in device of claim 15, wherein the second PCB is positioned at least partially on the first PCB.

20. The plug-in device of claim 15, wherein the second PCB is positioned on the first PCB to be within the first PCB's perimeter.

21. The plug-in device of claim 15, wherein the one or more electronic components includes a flash memory chip extending into the region.

* * * * *